United States Patent
Chang et al.

(10) Patent No.: US 8,125,611 B2
(45) Date of Patent: Feb. 28, 2012

(54) APPARATUS AND METHOD FOR IMMERSION LITHOGRAPHY

(75) Inventors: Ching-Yu Chang, Yilang County (TW); Tsai-Sheng Gau, Hsinchu (TW); Burn Jeng Lin, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 335 days.

(21) Appl. No.: 11/762,651

(22) Filed: Jun. 13, 2007

(65) Prior Publication Data

US 2008/0309891 A1  Dec. 18, 2008

(51) Int. Cl.
*G03B 27/42* (2006.01)
*G03B 27/52* (2006.01)
*G03B 27/58* (2006.01)

(52) U.S. Cl. ............... 355/30; 355/53; 355/72
(58) Field of Classification Search .......... 355/30, 355/53, 72, 74, 77; 359/227, 233, 361, 507, 359/509, 230
See application file for complete search history.

(56) References Cited

U.S. PATENT DOCUMENTS

| | | | | |
|---|---|---|---|---|
| 5,760,881 A * | 6/1998 | Miyazaki et al. | ............... | 355/71 |
| 6,078,381 A * | 6/2000 | Suzuki | ............... | 355/53 |
| 6,680,774 B1 * | 1/2004 | Heinle | ............... | 355/72 |
| 2002/0057423 A1 * | 5/2002 | Nogawa | ............... | 355/30 |
| 2005/0219488 A1 * | 10/2005 | Nei et al. | ............... | 355/53 |
| 2005/0286033 A1 * | 12/2005 | Lin et al. | ............... | 355/53 |
| 2007/0182943 A1 * | 8/2007 | Goodwin | ............... | 355/53 |
| 2007/0242242 A1 * | 10/2007 | Nagasaka et al. | ............... | 355/53 |
| 2008/0084550 A1 * | 4/2008 | Liu | ............... | 355/72 |
| 2008/0246935 A1 * | 10/2008 | Wakker et al. | ............... | 355/53 |
| 2008/0297748 A1 * | 12/2008 | Smeets et al. | ............... | 355/53 |

FOREIGN PATENT DOCUMENTS

WO   WO 2005055296 A1 *   6/2005

OTHER PUBLICATIONS

U.S. Appl. No. 11/671,046, filed Feb. 5, 2007.

* cited by examiner

*Primary Examiner* — Edward Glick
*Assistant Examiner* — Colin Kreutzer
(74) *Attorney, Agent, or Firm* — Haynes and Boone, LLP

(57) ABSTRACT

Immersion lithography apparatus and method using a shield module are provided. An immersion lithography apparatus including a lens module having an imaging lens, a substrate table positioned beneath the lens module and configured for holding a substrate for processing, a fluid module for providing an immersion fluid to a space between the lens module and the substrate on the substrate table, and a shield module for covering an edge of the substrate during processing.

20 Claims, 13 Drawing Sheets

APPARATUS AND METHOD FOR IMMERSION LITHOGRAPHY

BACKGROUND

The present disclosure relates generally to immersion photolithography and, more particularly, to an apparatus and method for shielding an edge of a wafer during an immersion photolithography process.

Immersion lithography is a relatively new advancement in photolithography, in which the exposure procedure is performed with a fluid filling the space between the surface of the wafer and the lens. Using immersion lithography, higher numerical apertures can be built than when using lenses in air, resulting in improved resolution. Further, immersion lithography provides enhanced depth-of-focus (DOF) for printing ever smaller features. A photoresist or resist layer is formed on the surface of the wafer for patterning. The resist layer is applied to the surface of the wafer by a spin coating process. However, there may be resist that forms on an edge of the wafer during spin coating and, when dry, can flake off and cause particles to contaminate active areas of the wafer and/or processing equipment such as the immersion lithography system. The process wafer can also easily accumulate particles at the wafer edge area, when a solvent removes the edge resist, such particles are uncovered and may contaminate the immersion lithography system. This can lead to pattern defects, pattern distortion, and/or pattern loss.

Therefore, what is needed is a simple and cost-effective apparatus and method for shielding the edge of the wafer to minimize contaminations being introduced to the immersion lithography system.

BRIEF DESCRIPTION OF THE DRAWINGS

The present disclosure is best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

The present disclosure relates generally to the liquid immersion photolithography systems, and, more particularly, to an immersion photolithography system using a sealed wafer bath. It is understood, however, that specific embodiments are provided as examples to teach the broader inventive concept, and one of ordinary skill in the art can easily apply the teachings of the present disclosure to other methods and systems. Also, it is understood that the methods and systems discussed in the present disclosure include some conventional structures and/or steps. Since these structures and steps are well known in the art, they will only be discussed in a general level of detail. Furthermore, reference numbers are repeated throughout the drawings for the sake of convenience and example, and such repetition does not indicate any required combination of features or steps throughout the drawings.

Generally, there are two system configurations in immersion lithography, including a lens-based ("LBC") system and a wafer-based ("WBC") system. With LBC systems, immersion fluid is selectively provided to and extracted from a small region between a lens system and a wafer and the immersion assembly is stationary with respect to the lens system as the wafer is stepped or scanned.

Figure 1:
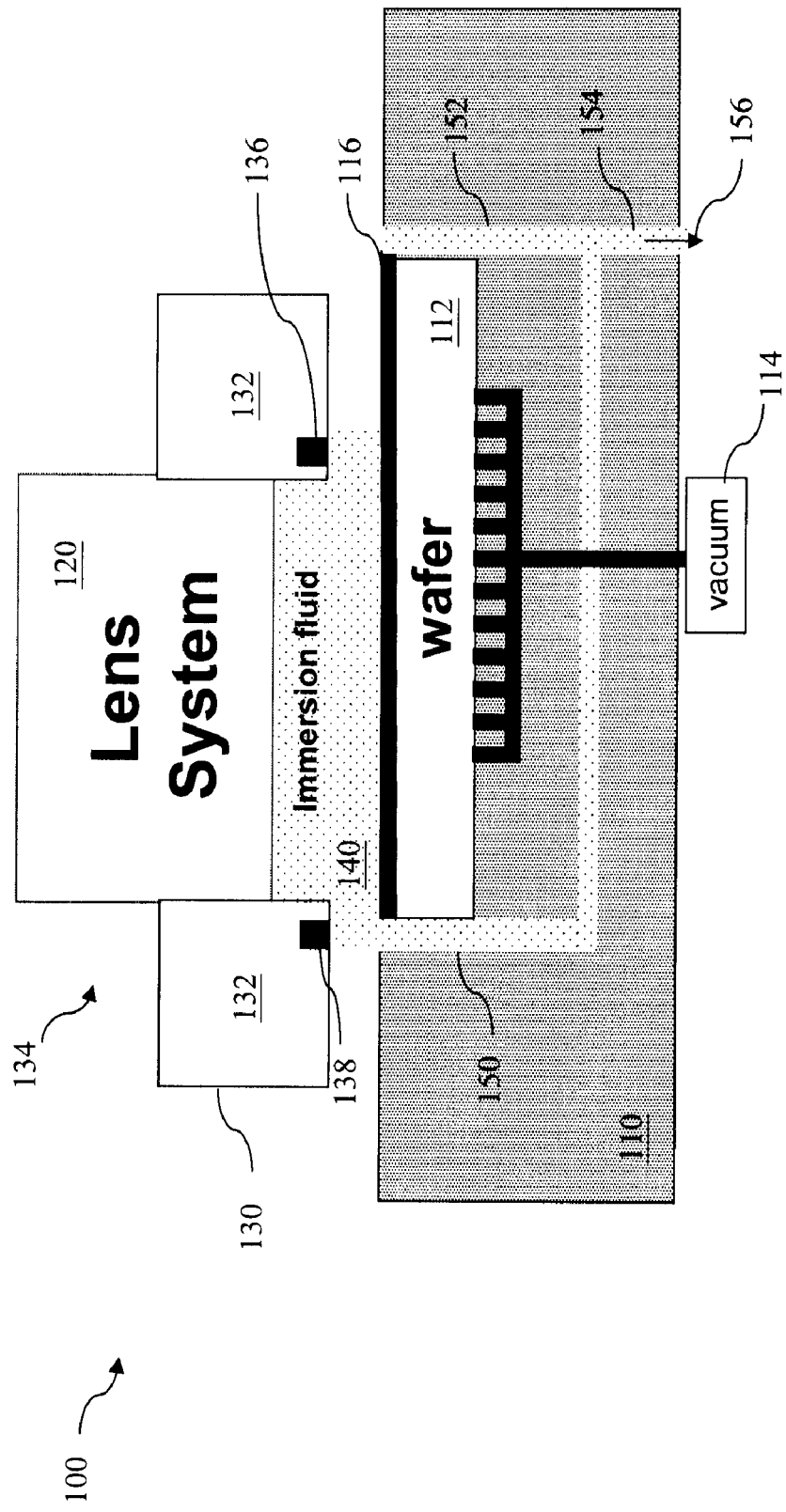
FIG. 1 is a schematic view of a lens-based ("LBC") immersion system.

Referring to FIG. 1, illustrated is a schematic view of a LBC system 100. The system 100 may include a wafer table 110 for holding a wafer 112 to be processed by the system 100. The wafer table 110 can be a wafer stage or include a wafer stage as a part thereof. The wafer table 110 is operable to secure and move the wafer 112 relative to the system 100. For example, the wafer table 110 may secure the wafer 112 via a vacuum chuck 114. The wafer table 110 may also be capable of translational and/or rotational displacement for wafer alignment, stepping, and scanning. The wafer table 110 may include various components suitable to perform precise movement.

The wafer 112 to be held by the wafer table 110 and processed by the system 100 may be a semiconductor wafer (or substrate) such as a silicon wafer. Alternatively, the semiconductor wafer may include an elementary semiconductor, a compound semiconductor, an alloy semiconductor, or combinations thereof. The semiconductor wafer may include one or more material layers such as poly-silicon, metal, and/or dielectric, to be patterned. The wafer 112 may further include an imaging layer 116 formed thereon. The imaging layer 116 can be a photoresist layer (resist layer, photosensitive layer, patterning layer) that is responsive to an exposure process for creating patterns. The imaging layer 116 may be a positive or negative type resist material and may have a multi-layer structure. One exemplary resist material is chemical amplifier (CA) resist.

The LBC system 100 may further include one or more imaging lens assemblies or systems (referred to as a "lens system") 120. The semiconductor wafer may be positioned on a wafer table 110 under the lens system 120. The lens system 120 may further include or be integral to an illumination system (e.g., a condenser) which may have a single lens or multiple lenses and/or other lens components. For example, the illumination system may include microlens arrays, shadow masks, and/or other structures. The lens system 120 may further include an objective lens which may have a single lens element or a plurality of lens elements. Each lens element may include a transparent substrate and may further include a plurality of coating layers. The transparent substrate may be a conventional objective lens, and may be made of fused silica (SiO2), calcium-fluoride (CaF2), lithium fluoride (LiF), barium fluoride (BaF2), or other suitable material. The materials used for each lens element may be chosen based on the wavelength of light used in the lithography process to minimize absorption and scattering.

The system 100 may also include an immersion fluid retaining module 130 for holding a fluid 132 such as an immersion fluid. The immersion fluid retaining module 130 may be positioned proximate (such as around) the lens system 120 and designed for other functions, in addition to holding the immersion fluid. The immersion fluid retaining module 130 and the lens system 120 may make up (at least in part) an immersion hood 134. The immersion fluid may include water (water solution or de-ionized water (DIW)), high n fluid (n is index of refraction, the n value at 193 nm wavelength here is larger than 1.44), gas, or other suitable fluid.

The immersion fluid retaining module 130 may include various apertures (or nozzles) for providing the immersion fluid for an exposure process. Particularly, the module 130 may include an aperture 136 as an immersion fluid inlet to provide and transfer the immersion fluid into a space 140 between the lens system 120 and the wafer 112 on the wafer table 110. The immersion fluid substantially covers an area of the wafer 112 that will be exposed to form a pattern thereon. The module 130 may also include an aperture 138 as an immersion fluid outlet to remove and transfer the immersion fluid from the space 140. It is understood that the immersion fluid may be provided to and from the space 140 at a sufficient rate by components suitable for this type of movement. Additionally, the immersion fluid outlet may be part of a drain system for removing the immersion fluid from the LBC system 100.

The drain system may further include a plurality of extraction (or suck back) lines 150, 152 located proximate to an edge of the wafer 112 for removing a portion of the immersion fluid provided to the space 140 between the lens system 120 and the wafer 112 on the wafer table 110. Alternatively, the plurality of extraction lines 150, 152 may be part of a stage drain system. The extraction lines 150, 152 may merge into a single line 154 that provides a such back force 156 to remove the immersion fluid from the system 100. The extraction lines 150, 152 may be incorporated or integrated with the wafer table 110. It is understood that the number of extraction lines may vary and will depend on the type of immersion lithography system that is used.

The LBC system 100 may further include a radiation source (not shown). The radiation source may be a suitable ultraviolet (UV) or extreme ultraviolet (EUV) light source. For example, the radiation source may be a mercury lamp having a wavelength of 436 nm (G-line) or 365 nm (I-line); a Krypton Fluoride (KrF) excimer laser with wavelength of 248 nm; an Argon Fluoride (ArF) excimer laser with a wavelength of 193 nm; a Fluoride (F2) excimer laser with a wavelength of 157 nm; or other light sources having a desired wavelength (e.g., below approximately 100 nm).

A photomask (also referred to as a mask or a reticle) may be introduced into the system 100 during an immersion lithography process. The mask may include a transparent substrate and a patterned absorption layer. The transparent substrate may use fused silica (SiO2) relatively free of defects, such as borosilicate glass and soda-lime glass. The transparent substrate may use calcium fluoride and/or other suitable materials. The patterned absorption layer may be formed using a plurality of processes and a plurality of materials, such as depositing a metal film made with chromium (Cr) and iron oxide, or an inorganic film made with MoSi, ZrSiO, SiN, and/or TiN.

Figure 2:
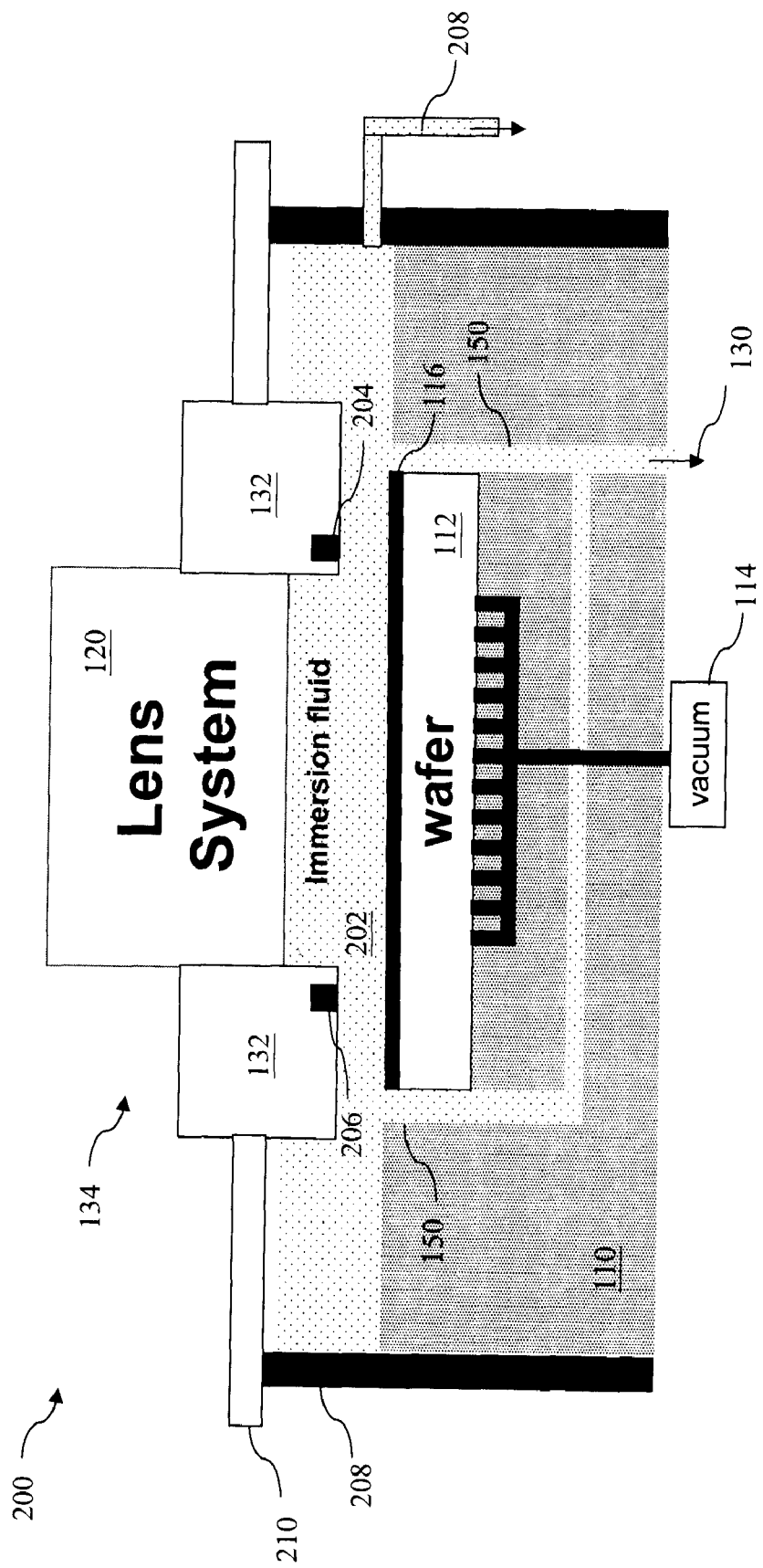
FIG. 2 is a schematic view of a wafer-based ("WBC") immersion system.

In contrast to LBC systems, in WBC systems, a wafer may be completely immersed in immersion fluid in a circulating tank in a wafer table. Referring to FIG. 2, illustrated is a schematic view of a WBC system 200. Similar features in FIGS. 1 and 2 are numbered the same for simplicity and clarity. In the WBC system, an immersion fluid is selectively introduced into and removed from a region 202 between a lens system 120 and a wafer 112 via a fluid inlet 204 and a fluid outlet 206. The WBC system may include a wafer gate 208 disposed on either side of the wafer table 110 for retaining the immersion fluid in the region 202. Additionally, the immersion fluid may be removed from the region 202 by a plurality of extraction (or suck back) lines 150, 152 located proximate to an edge of the wafer 112 and a drain line 208 located at the wafer gate 208. It is understood that other drain lines may be provided to aid in removing the immersion fluid. The immersion fluid may circulate in the region 202 under and over the wafer table 110 continuously and may be filtered and temperature-regulated as it moves across the surface area of the wafer 112. The immersion fluid can be completely drained from the region 202 to allow for loading and unloading of the wafer 112. The system 200 may include a cover 210 that prevents the immersion fluid in the region 202 from spilling over and foreign particles from being introduced to the immersion fluid.

Figure 3A:
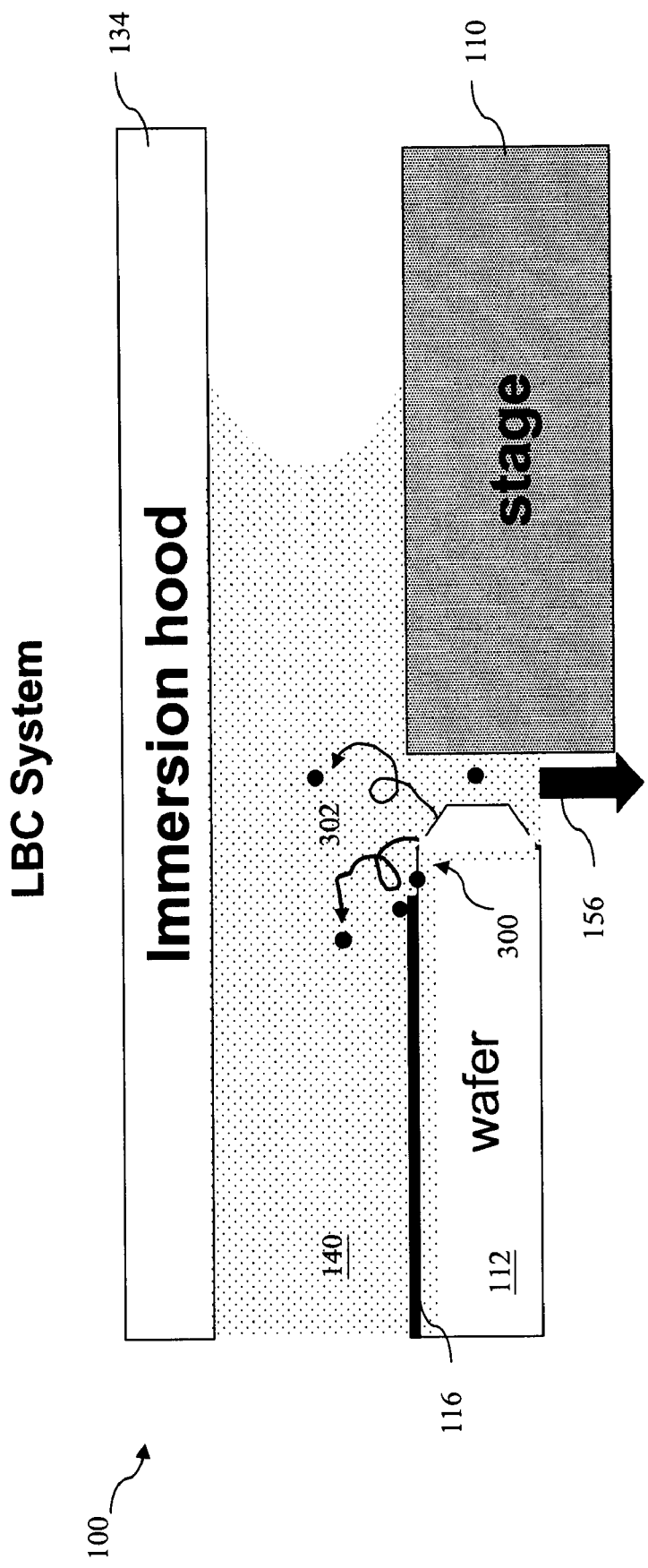
FIGS. 3A and 3B are enhanced schematic views of a problem associated with the LBC immersion system of FIG. 1 and WBC immersion system of FIG. 2, respectively.
Figure 3B:
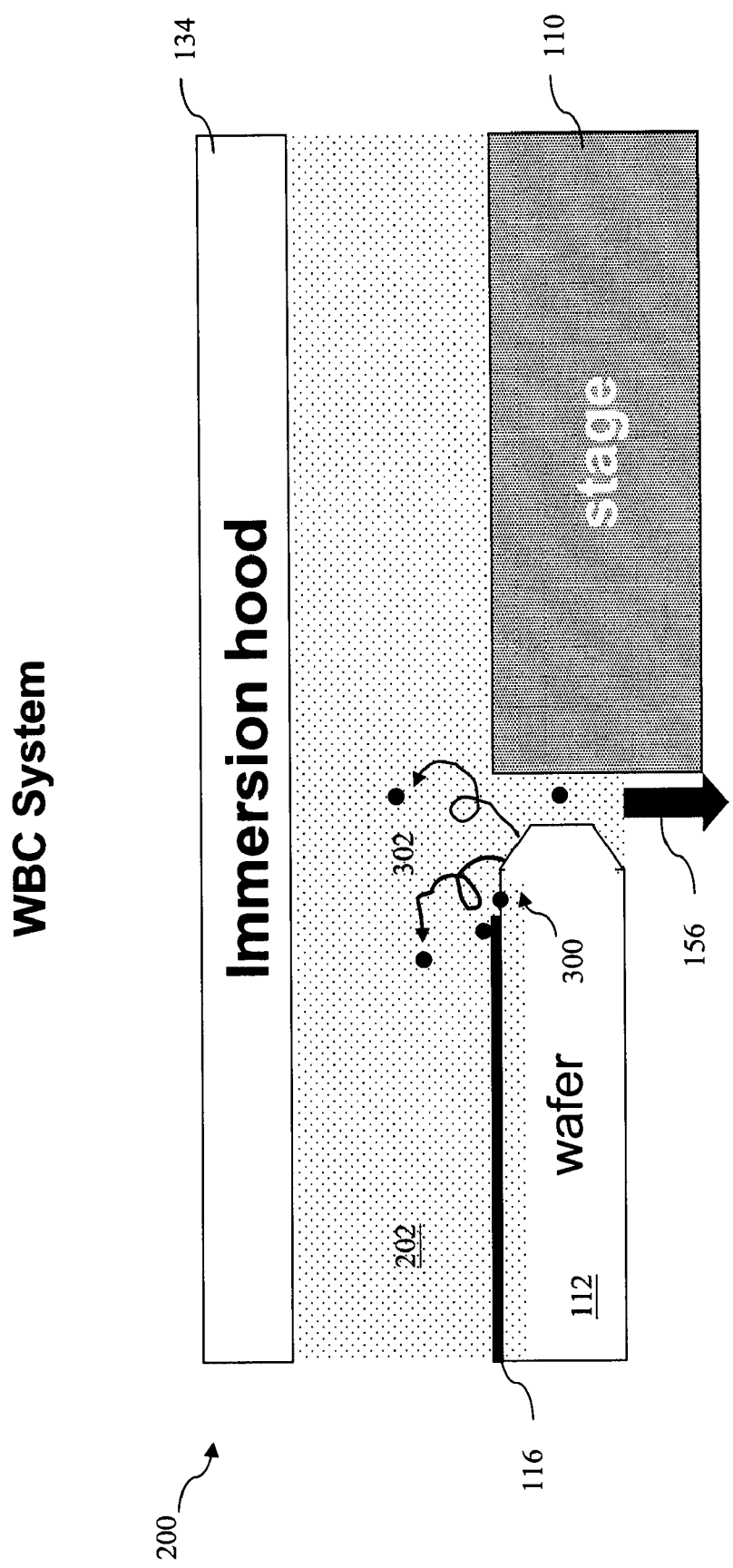

Referring now to FIGS. 3A and 3B, illustrated are enhanced schematic views of one of the problems associated with the systems described in FIGS. 1 and 2 above. Similar features in FIGS. 1 and 3A, and in FIGS. 2 and 3B are numbered the same for simplicity and clarity. In FIGS. 3A and 3B, a photoresist layer 116 may be formed on a surface of the wafer 112 for patterning. The photoresist at the edge 300 of the wafer 112 (also referred to as the edge bead) may be thicker than the rest of the photoresist layer 116 or may be etched away by a solvent to clear the edge area of the photoresist covering. This leaves the possibility of broken resist fragments and/or particles from the edge area 302 under the movement of the immersion fluid that may contaminate the systems 100, 200.

Figure 4A:
FIGS. 4A and 4B are a cross-sectional view and top view, respectively, of a shield structure that may be implemented with the LBC and WBC immersion system of FIGS. 1 and 2.
Figure 4B:
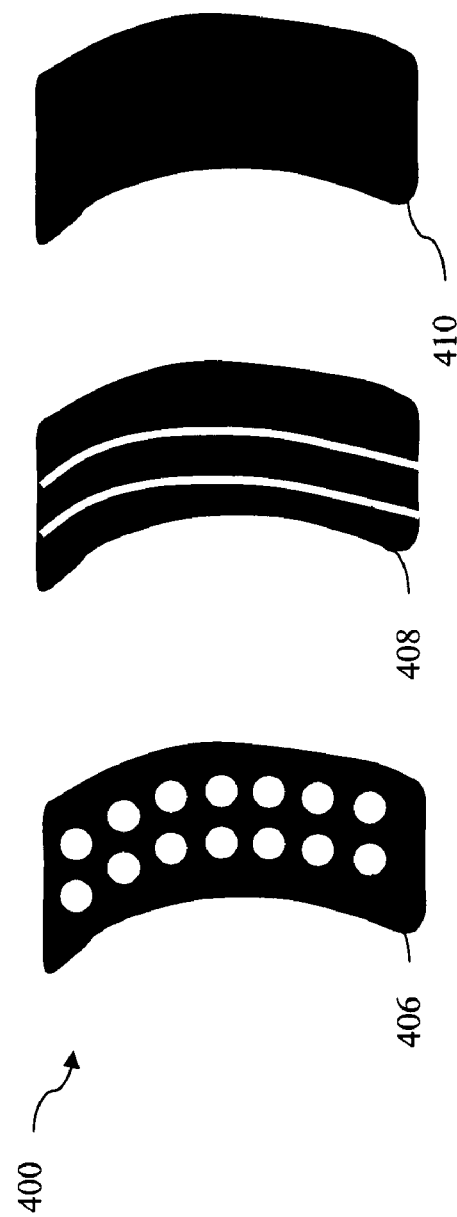

Referring now to FIGS. 4A and 4B, illustrated are a cross-sectional view and top view of a shield section 400 that may be implemented with the LBC and WBC immersion system 100, 200 of FIGS. 1 and 2. The shield section 400 may include a body portion 402 and a cover portion 404. The body portion 402 may be coupled to the immersion system such that the shield section 400 may be moved in various positions as will be discussed later. The cover portion 404 may be curved so that it can shield an area around an edge of the wafer. The shield section 400 may be made of stainless steel or alloy. Alternatively, the shield section 400 may optionally be made of quartz or other suitable transparent material. In FIG. 4B, the shield section 400 may include a plurality of openings for hydrodynamic control of the immersion fluid. In one embodiment, the shield section 400 may include a plurality of holes or circles 406. In another embodiment, the shield section 400 may include a plurality of slits 408. It is understood that the openings may include various shapes such as a polygon, oval, irregular shape, or combinations thereof. Alternative, the shield section 400 may be free of openings 410.

Figure 5A:
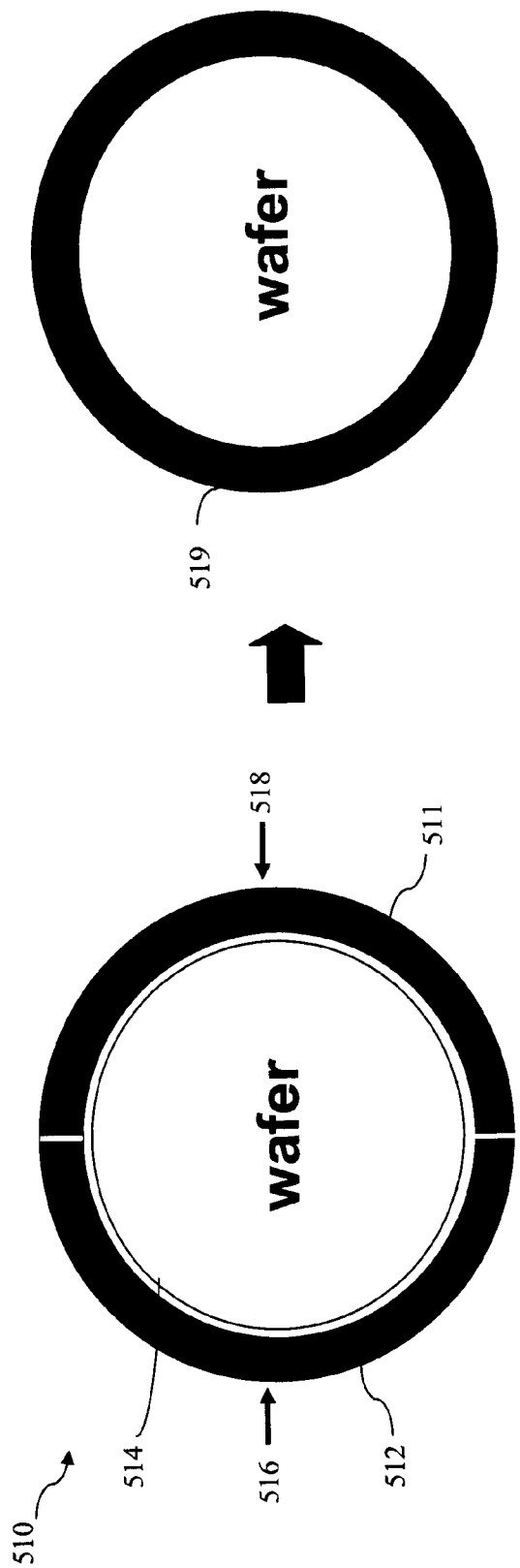
FIGS. 5A through 5C are top views of several shield modules that may be utilized in the immersion systems of FIGS. 1 and 2.
Figure 5B:
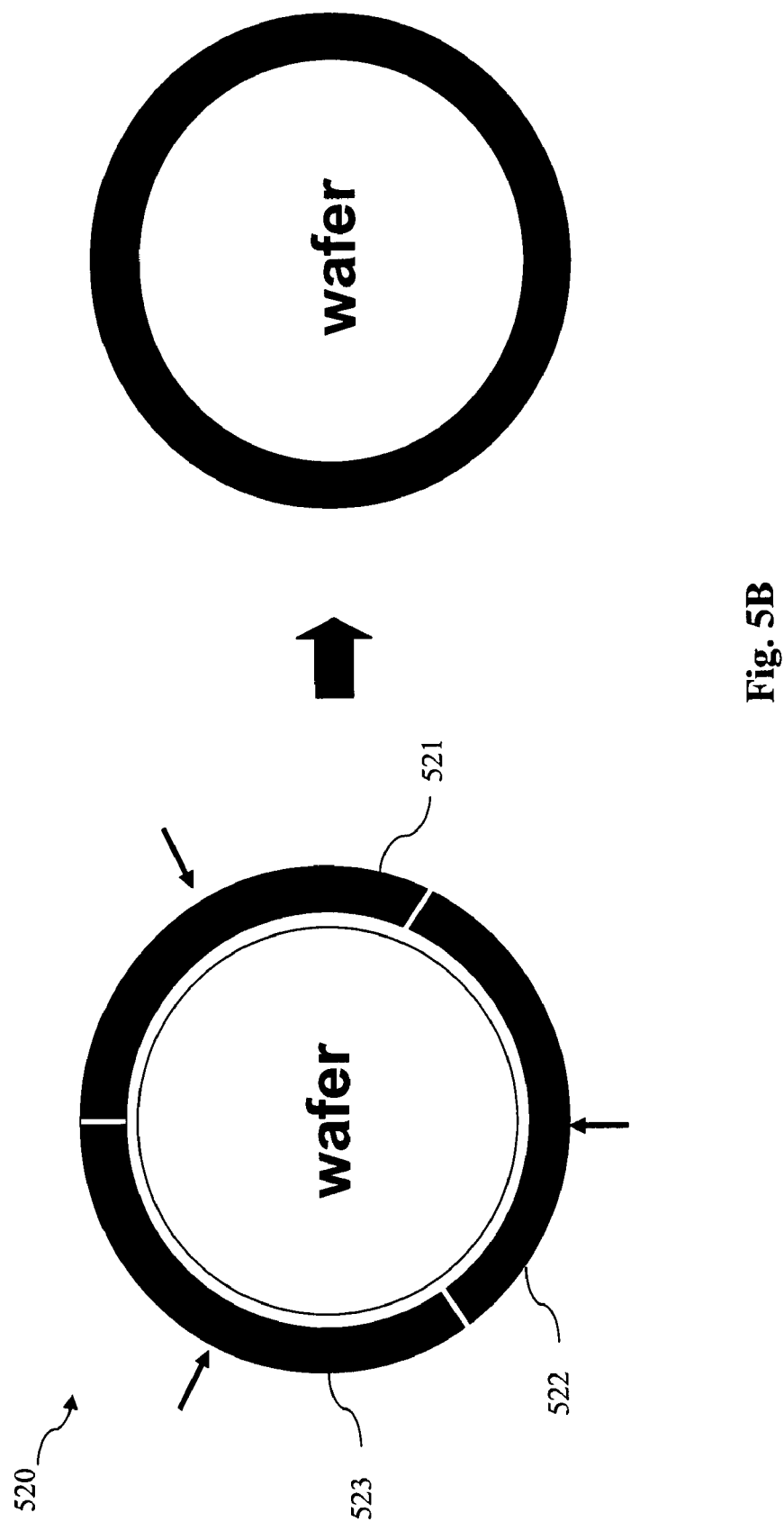
Figure 5C:
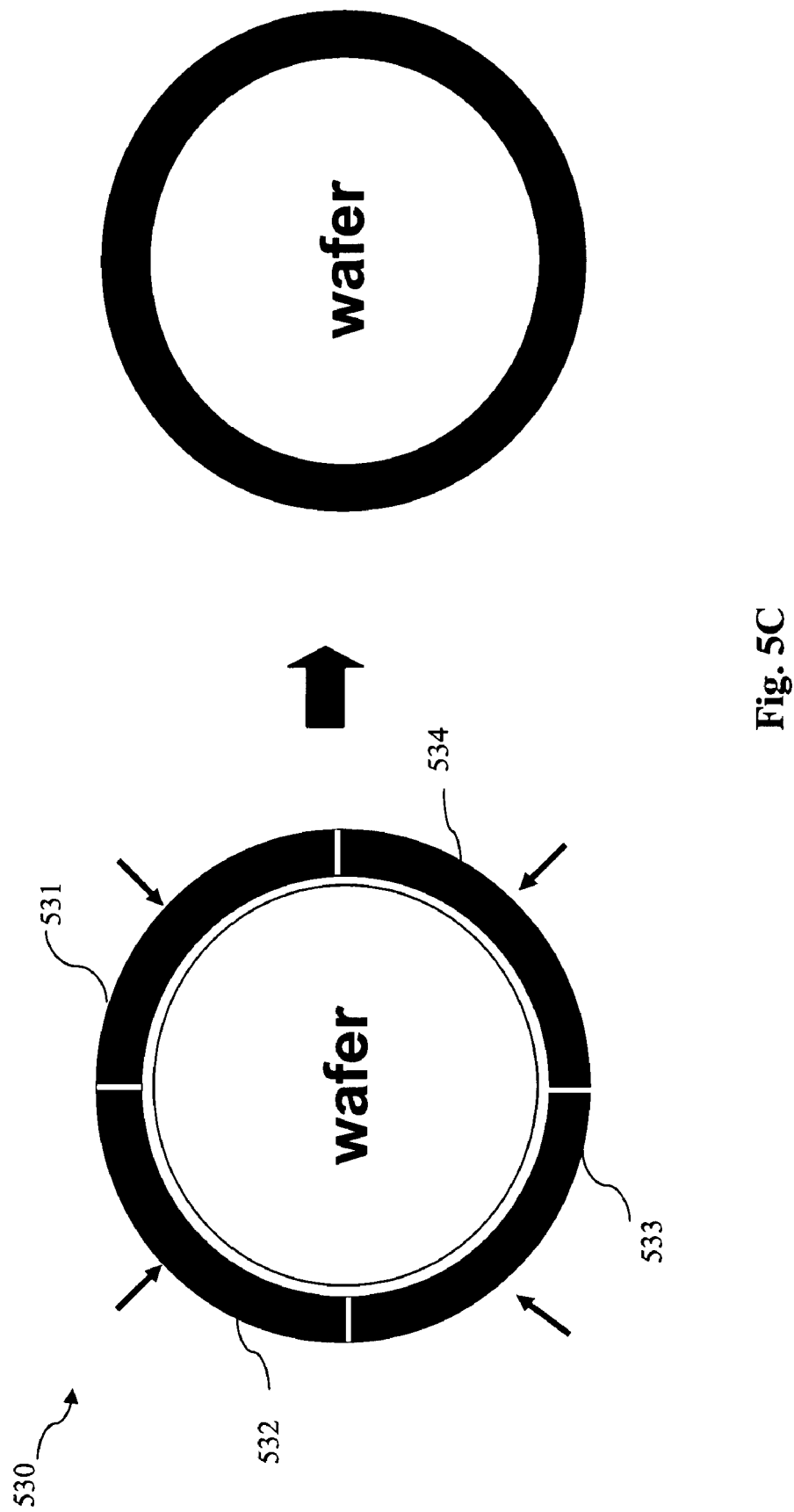

Referring now to FIGS. 5A through 5C, illustrated are top views of several shield modules utilizing a plurality of shield sections 400 of FIG. 4A. In FIG. 5A, a shield module 510 may include two shield sections 511, 512. In an open position, the two shield sections 511, 512 may be moved radially outward (e.g., away from the center of the wafer) such that a wafer may be loaded in a space defined by the two shield sections. An edge 514 of the wafer is proximate to the cover portion 404 (FIG. 4A) of the shield sections 511, 512. In a close position, the two shield sections 511, 512 may be moved 516, 518 radially inward (e.g., towards the center of the wafer) such that the cover portion 404 of the shield sections 511, 512 covers 520 an area around the edge of the wafer. In FIG. 5B, a shield module 520 is similar to the shield configuration 510 of FIG. 5A except that it includes three shield sections 521, 522, 523 for covering the area around the edge of the wafer. In FIG. 5C, a shield module 530 is similar to the shield configuration 510 of FIG. 5A except that it includes four shield sections 531, 532, 533, 534 for covering the area around the edge of the wafer. The shield sections may be moved radially inward/outward by a mechanical, electro-mechanical, pneumatic, or other suitable mechanism. Additionally, it is understood that the shield modules described above mere examples and that the number of shield sections implemented may vary and will depend on the design specification of the immersion lithography system. Alternatively, the shield module may include a single cover plate or section.

Figure 6:
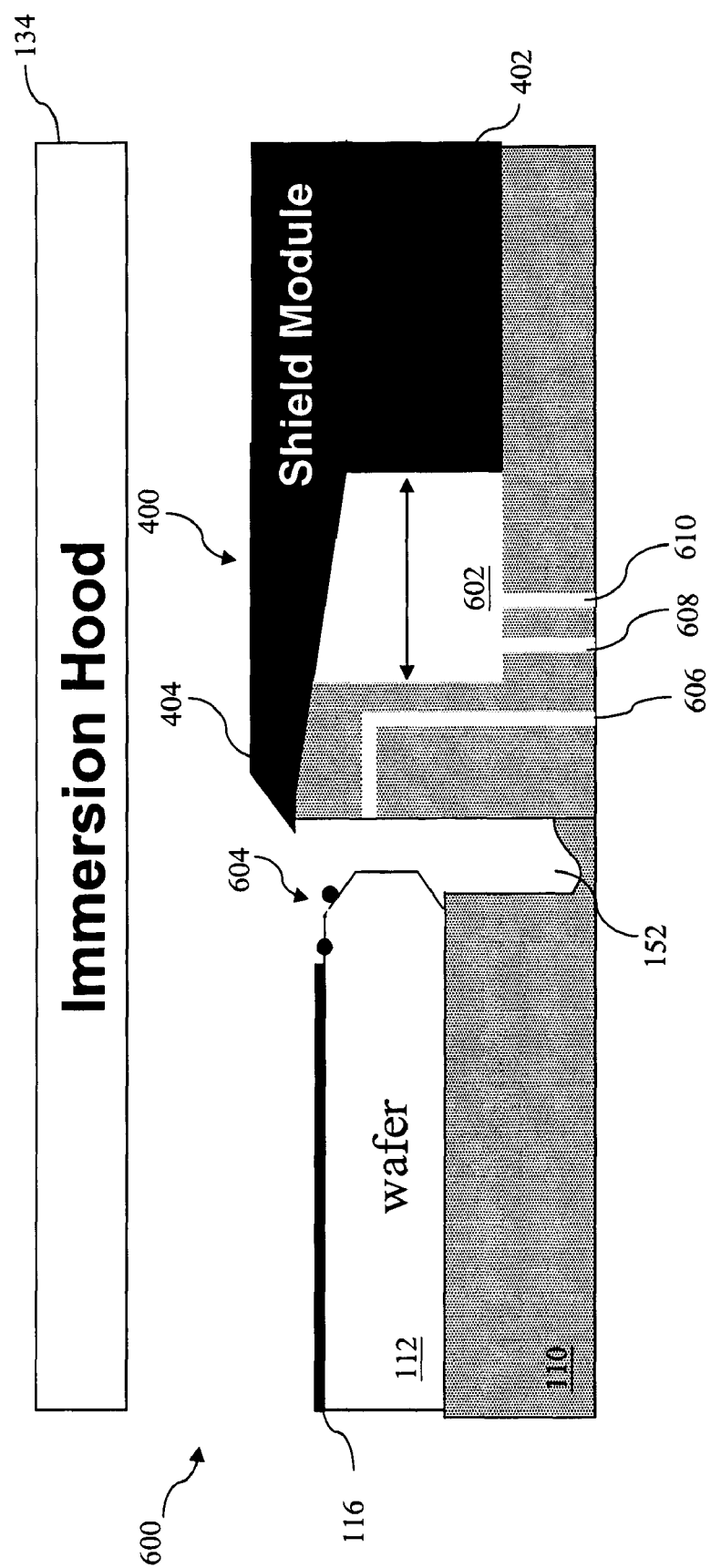
FIG. 6 is an enhanced schematic view of part of an immersion lithography system utilizing one of the shield modules of FIGS. 5A through 5C.

Referring now to FIG. 6, illustrated is an enhanced schematic view of part of an immersion lithography system 600 utilizing one of the shield modules 510, 520, 530 of FIGS. 5A through 5C. The immersion lithography system is similar to the LBC system of FIG. 1 except for the additional features described below. Similar features in FIGS. 1 and 6 are numbered the same for clarity. It is understood that only one shield section of the shield module is shown for simplicity. As previously discussed, the shield section 400 may include a body portion 402 and a cover portion 404. The body portion 402 may be secured in a space 602 around a wafer stage 110. The body portion 402 may be moved within the space 602 such that an area around the wafer edge 604 that is shielded by the cover portion 404 can be adjusted. The shield section 400 may be moved in an open position as was described in FIG. 5A. Accordingly, a wafer 112 having a photoresist layer 116 formed thereon may be loaded and secured on the wafer stage 110. In the open position, the cover portion 404 does not shield the wafer edge 604.

The system 600 may further include a plurality of inlets and outlets for performing various functions. For example, a first line 606 may provide a fluid such as de-ionized water to clean a stage drain extraction line 152. The first line 606 may also provide the fluid to control a wafer surface moisture since there are instances when the immersion fluid does not cover the wafer edge 604. Alternatively, the first line 606 may be used as a back up drain line for the system. The second and third lines 608, 610 may be configured as an inlet or outlet. The second line 608 may provide a fluid for cleaning the cover portion 404 and the third line 610 may remove the fluid after the cleaning. Alternatively, the second line 608 may provide a fluid for maintaining temperature stability around the area 602 and the third line 610 may remove the fluid.

Figure 7:
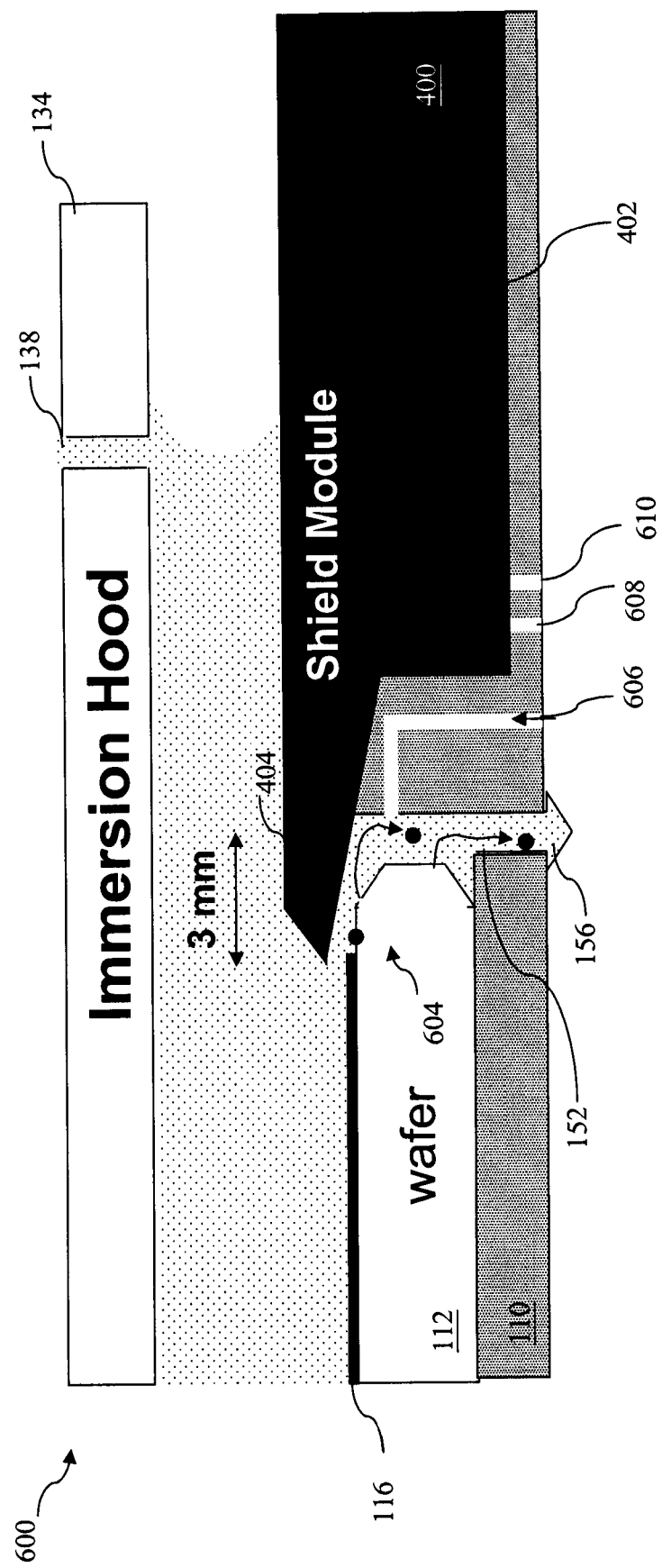
FIG. 7 is an enhanced schematic view of part of the immersion lithography system of FIG. 6 with the shield module in a closed position.

Referring now to FIG. 7, illustrated is an enhanced schematic view of part of the immersion lithography system 600 of FIG. 6 with the shield section 400 in a closed position. As previously discussed, the shield section 400 may be moved 700 radially inward such that the cover portion 404 may shield the area around the edge 604 of the wafer 112. For example, the area that is 3 mm from the edge 604 of the wafer 112 may be covered. A thickness of the cover portion 404 may range between 10 to 100 μm. It is understood that the dimensions disclosed herein are mere examples and that other dimensions may be implemented depending on the specific application.

The wafer stage 110 may be positioned beneath the immersion hood and an immersion fluid is provided to a space between the lens system and the wafer. The immersion fluid may be removed via a fluid outlet 138 of the immersion hood 134 and the extraction line 152 of the wafer table 110. Accordingly, the particles and/or fragments at the wafer edge 604 will be trapped by the cover portion 404 and will be removed by a suck back force 156 of an extraction line 152 located proximate to the wafer edge 604. The particles and/or fragments are prevented from circulating back into the immersion fluid and/or photoresist layer and thus, contaminating the system. The particles and/or fragments at the wafer edge 604 will also be trapped and removed when the wafer table 110 may be moved to a next exposure location. Additionally, the shield section 400 may be moved 700 such that the area around the wafer edge 604 that is shielded by the cover portion 404 can be adjusted. This can be done according to a particular recipe. It is understood that the shield module described in FIGS. 6 and 7 may also be implemented with the WBC system 200 of FIG. 2 in a similar manner.

Figure 8:
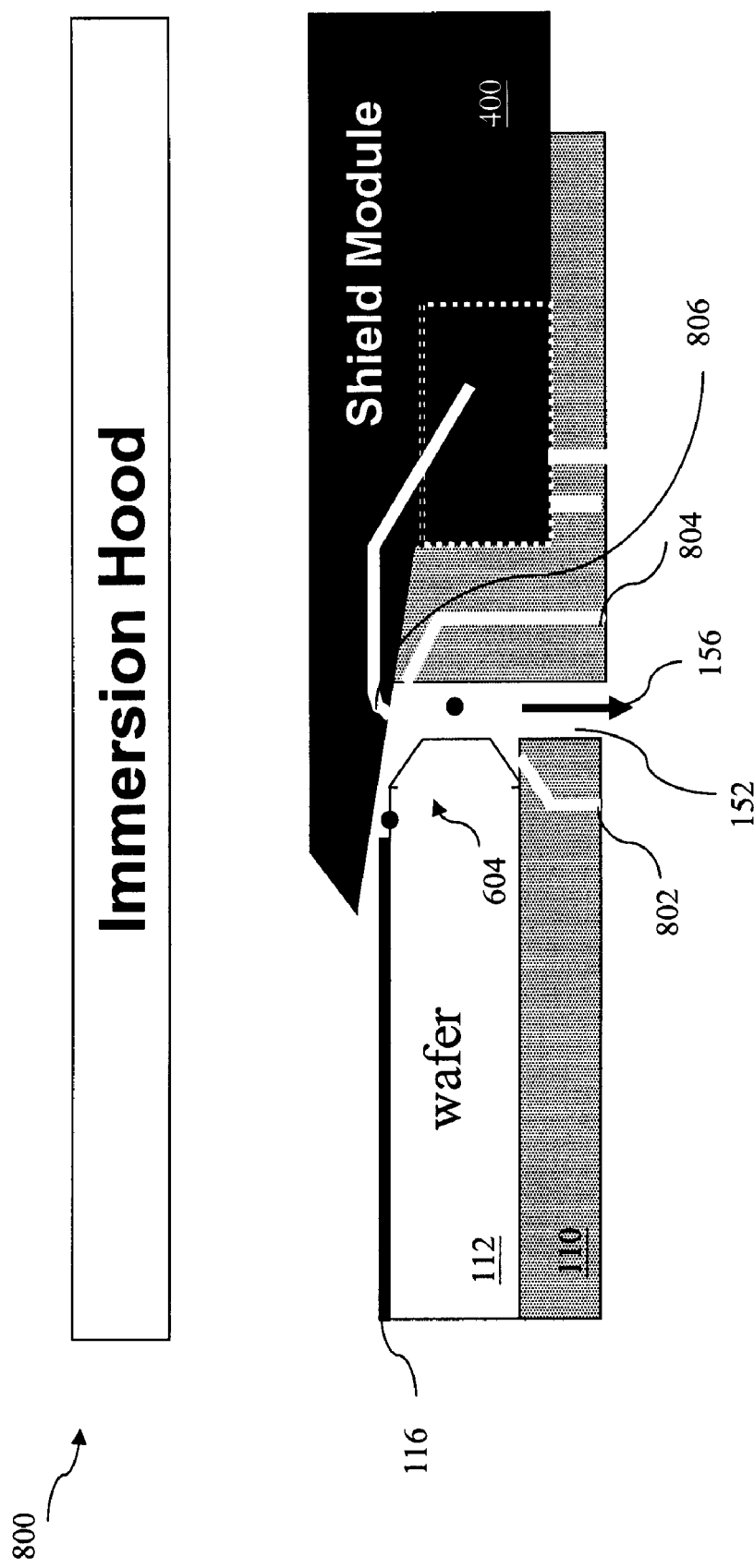
FIG. 8 is a schematic view of part of an immersion lithography system having a plurality of fluid or air lines.

Referring now to FIG. 8, illustrated is a schematic view of part of an immersion lithography system 800 having a plurality of fluid or air lines. The immersion lithography system 800 is similar to the immersion lithography system 600 of FIG. 6 except for the following additional features discussed below. Similar features in FIGS. 6 and 8 are numbered the same for simplicity and clarity. The immersion lithography system 800 may include a plurality of fluid or air lines disposed at various locations. When the immersion fluid does not cover a wafer edge, a stage drain extraction line 152 continues to provide a suck back force 156 that sucks air from the wafer surface. As a result, an evaporation phenomena may be enhanced at the wafer edge 604 and thus, may decrease a surface temperature at the wafer edge. This temperature difference may adversely affect the exposure process. A first fluid line 802 may be located under a wafer table 110, a second fluid line 804 may be located under the shield section 400, and a third fluid line 806 may be located inside the shield section 400. The first, second, and third fluid lines 802, 804, 806 may provide air, liquid, or moist air for suck back stability control of the extraction line 152. This may reduce the cooling effect of the wafer edge and surface.

Figure 9:
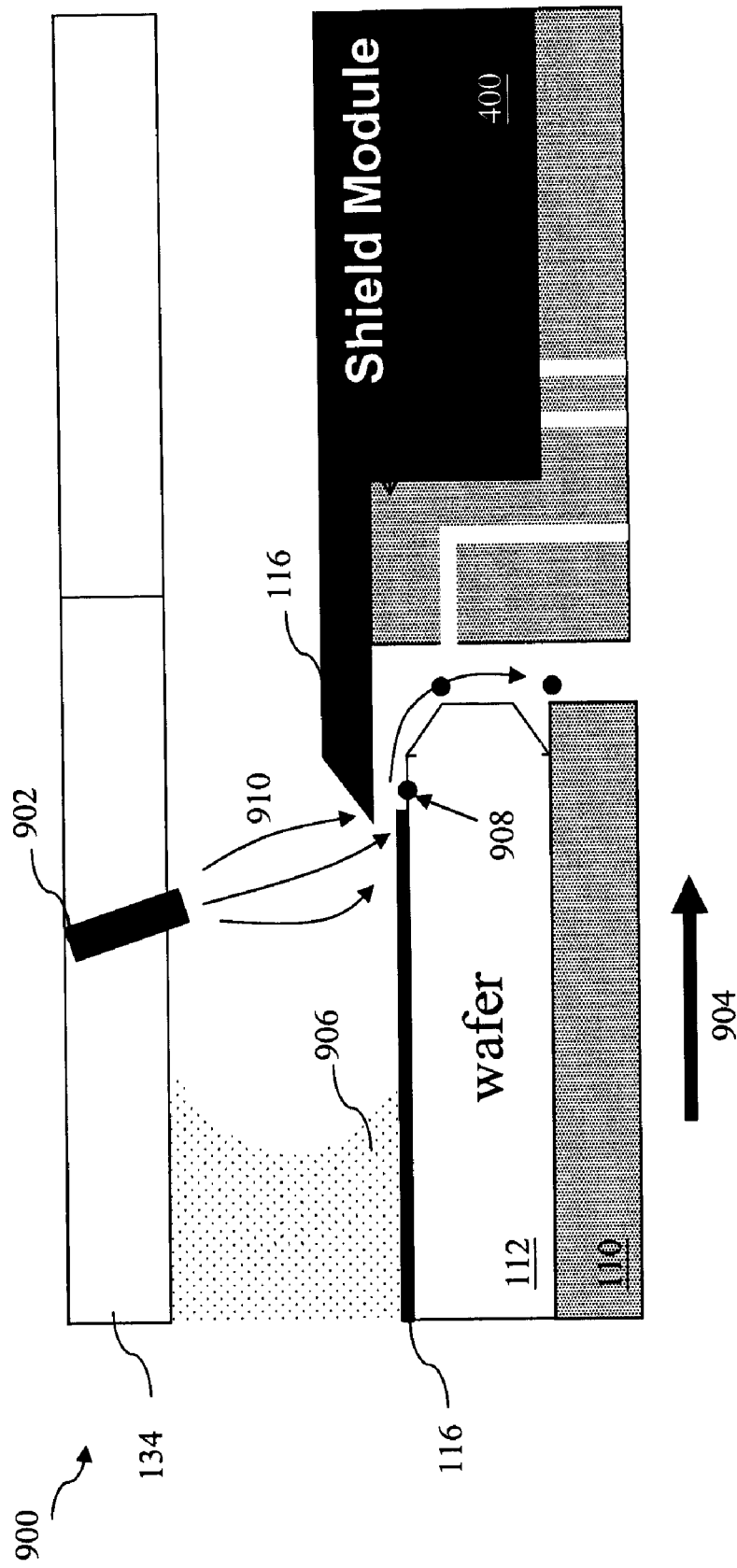
FIG. 9 is a schematic view of part of an immersion lithography system having a purging unit.

Referring now to FIG. 9, illustrated is a cross-sectional view of part of an immersion lithography system 900 having a purging unit. The immersion lithography system 900 is similar to the immersion lithography system 600 of FIG. 6 except for the following additional features discussed below. Similar features in FIGS. 6 and 9 are numbered the same for simplicity and clarity. The immersion lithography system 900 may include a purging unit 902 positioned with an immersion hood 134. During processing, the wafer table 110 may moved 904 from the center of the immersion hood 134 to the edge of the immersion hood to pattern the center of the wafer 112. Accordingly, the immersion fluid no longer covers the wafer edge 604. However, a tailing effect 906 of the immersion fluid and step height of the photoresist layer 116, as the wafer table 110 is moved, may generate water drop residues 908 at a slit area of the wafer edge 604 that was covered by the shield section 400. The purging unit 902 may be configured to purge 910 gas, air, or other suitable fluid to dry and/or clean the slit area of the wafer edge 604.

Figure 10:
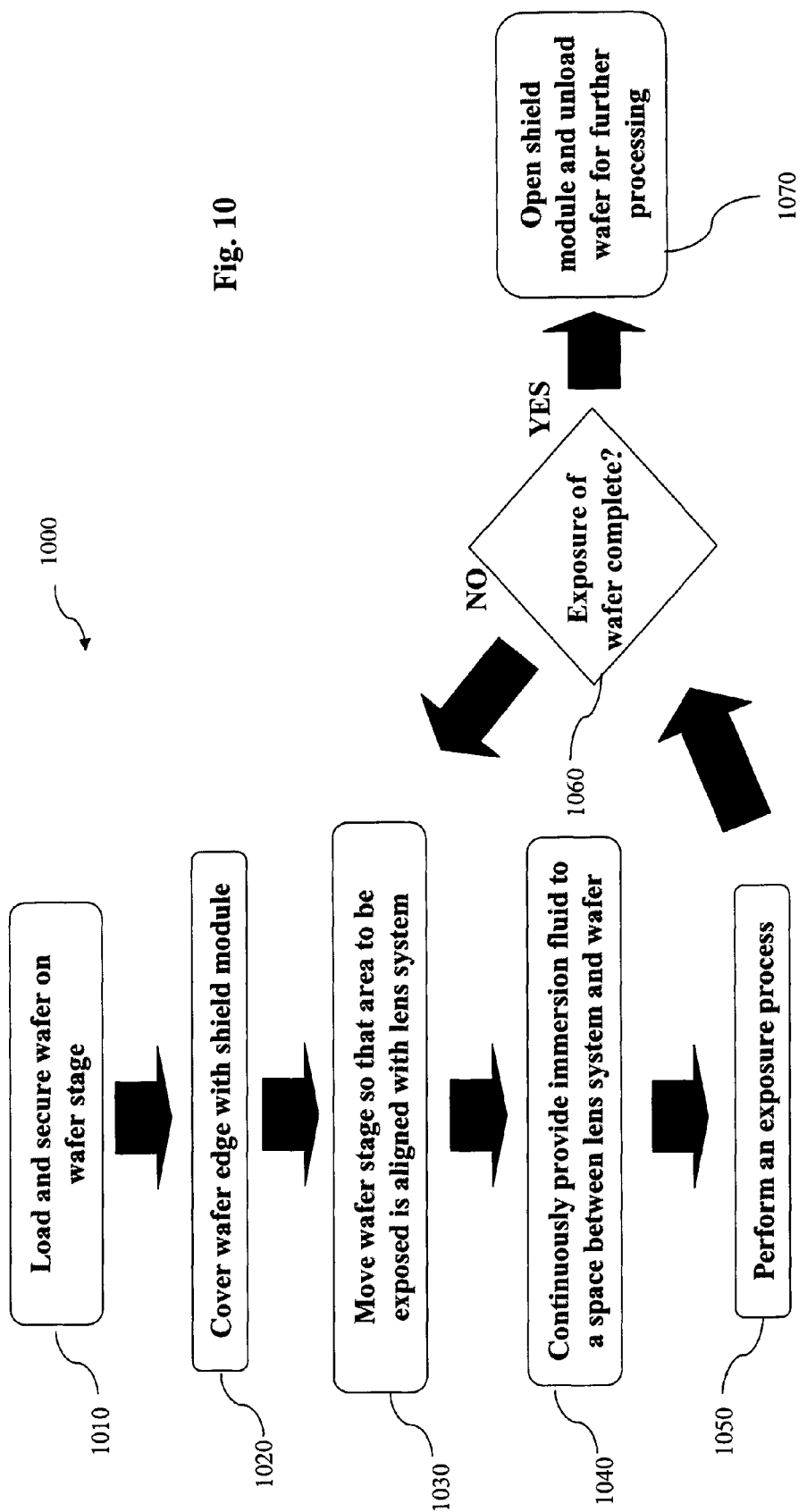
FIG. 10 is a flowchart of an immersion lithography method that may be implemented in the immersion lithography system of FIGS. 6-9.

Referring now to FIG. 10, illustrated is a flowchart of an immersion lithography method 1000 according to one or more embodiments of the present disclosure. The method 1000 may be implemented in the immersion lithography system of FIGS. 6 through 9. The method 1000 begins with step 1010 in which a wafer may be loaded and secured on a wafer stage via a vacuum chuck. The wafer stage may be disposed beneath an immersion hood. The wafer may include a photoresist layer ready for patterning. The method 1000 continues with step 1020 in which an edge of the wafer may be covered by a shield module similar to the one described in FIGS. 5A through 5C. The particles and/or fragments at the wafer edge will be trapped by the shield module and removed by a stage drain extraction line located proximate to the wafer edge.

The method 1000 continues with step 1030 in which the wafer stage may be moved a location so that an area of the photoresist layer to be exposed may be aligned with the lens system of the immersion hood in which immersion fluid is filled between the lens and wafer. The method 1000 continues with step 1040 in which an immersion fluid may be continuously provided to a space between the lens system and the wafer. It is understood that the immersion fluid may be provided and removed at a substantially constant rate. The immersion fluid may be removed from the space by the drain system including extraction lines located with the immersion hood and wafer stage. If the immersion fluid does not cover an edge of the wafer, the extraction lines located proximate to the edge may be provided with a fluid such as moist air for minimizing a cooling effect on the surface of the wafer.

The method 1000 continues with step 1050 in which an exposure process may be performed on the area of the photoresist layer to form a pattern. The exposure process may include exposing the area with a radiation source through a photomask to transfer a pattern to the photoresist. The method 1000 continues with step 1060 in which a decision may be made as to whether exposure of the entire wafer has been completed.

If the answer is no, the method 1000 repeats steps 1030 through 1060. If the answer is yes, the method 1000 continues with step 1070 in which the shield module opens and the wafer may be unloaded from the immersion lithography system. The exposed photoresist layer may go through further processing steps such as a post-exposure bake process and a development process to form a patterned photoresist layer. These processes are known in the art and thus, are not described in detail here.

Although only a few exemplary embodiments of this invention have been described in detail above, those skilled in the art will readily appreciate that many modifications are possible in the exemplary embodiments without materially departing from the novel teachings and advantages of this invention. It is understood that various different combinations of the above-listed embodiments and steps can be used in various sequences or in parallel, and there is no particular step that is critical or required. Furthermore, features illustrated and discussed above with respect to some embodiments can be combined with features illustrated and discussed above with respect to other embodiments. Accordingly, all such modifications are intended to be included within the scope of this invention.

Thus, provided is an immersion lithography apparatus including a lens module having an imaging lens, a substrate table positioned beneath the lens module and configured for holding a substrate for processing, a fluid module for providing an immersion fluid to a space between the lens module and the substrate on the substrate table, and a shield module for covering an edge of the substrate during processing. In some embodiments, the shield module includes no openings. In some other embodiments, the shield module includes at least one opening. In other embodiments, the at least one opening includes a slit. In still other embodiments, the shield module includes at least two separate sections that are adjustable to cover an area around the edge of the substrate during processing. In some embodiments, the at least two separate sections are configured to move radially.

In other embodiments, the substrate table includes a plurality of drain lines disposed proximate to the edge of the substrate and underneath the shield module. The plurality of drain lines are configured to remove a portion of the immersion fluid provided to the space between the lens module and the substrate on the substrate table. In some other embodiments, the shield module includes at least one fluid line for supplying a fluid to a space between the edge of the substrate and the shield module when the immersion fluid does not cover the edge of the substrate. In still other embodiments, the substrate table includes at least one fluid line for supplying a fluid to a space between the edge of the substrate and the shield module when the immersion fluid does not cover the edge of the substrate.

Also provided is an immersion lithography method including the steps of loading and securing a wafer onto a wafer stage disposed beneath an imaging lens; covering an edge of the wafer stage by a shield module; moving the wafer stage so that an area of the wafer to be exposed is aligned with the imaging lens; performing an exposure process to the area of the wafer; and moving the wafer stage to a next location and repeating some of the previous steps until exposure of the entire wafer is complete. In some embodiments, the step of loading and securing the wafer includes moving at least two separate sections of the shield module radially outward. In some other embodiments, the step of covering the edge of the wafer includes moving at least two separate sections of the shield module radially inward to cover an area around the edge of the wafer.

In other embodiments, the method further includes the step of adjusting the shield module according to a recipe setting. In some other embodiments, the method further includes the step of supplying a fluid to a space between the edge of the wafer and the shield module when the immersion fluid does not cover the edge of the wafer during processing. In still other embodiments, the method further includes the steps of providing a wafer having a photoresist layer formed thereon; performing a post-exposure bake on the exposed photoresist layer; and developing the exposed photoresist layer to form a patterned photoresist layer.

Additionally, an immersion lithography system is provided which includes an immersion hood having an imaging lens module and a fluid retaining module, the fluid retaining module provides an immersion fluid; a wafer stage disposed beneath the immersion hood for securing a wafer to be processed; a drain system for removing the immersion fluid provided to a space between the immersion hood and the wafer on the wafer stage, the drain system includes a plurality of extraction lines located in the immersion hood and the wafer stage; and a cover plate for covering an area around an edge of the wafer during processing. In some embodiments, the cover plate includes a plurality of sections, each section is configured to move radially such that the covered area around the edge of the wafer can be adjusted. In some other embodiments, the cover plate includes at least one fluid line for supplying a fluid to the edge of the wafer. In other embodiments, the wafer stage includes at least one fluid line for supplying a fluid to the edge of the wafer. In still other embodiments, the immersion hood include at least one purge unit for purging a space between the edge of the wafer and the cover plate with a fluid.

What is claimed is:

1. An immersion lithography apparatus, comprising:
a lens module including an imaging lens;

a substrate table positioned beneath the lens module and configured for holding a substrate for processing;

a fluid module for providing an immersion fluid to a space between the lens module and the substrate on the substrate table; and a shield module for covering an edge of the substrate and a portion of a top surface of the substrate that extends from the edge without contacting the substrate during processing, wherein at least a portion of the shield module has a curved shape.

2. The apparatus of claim 1, wherein the shield module includes no openings.

3. The apparatus of claim 1, wherein the shield module includes at least one opening.

4. The apparatus of claim 3, wherein the at least one opening includes a slit.

5. The apparatus of claim 1, wherein the shield module includes at least two separate sections that are adjustable to cover an area around the edge of the substrate during processing.

6. The apparatus of claim 5, wherein the at least two separate sections are configured to move radially.

7. The apparatus of claim 1, wherein the substrate table includes a plurality of drain lines disposed proximate to the edge of the substrate and underneath the shield module, wherein the plurality of drain lines are configured to remove a portion of the immersion fluid provided to the space between the lens module and the substrate on the substrate table.

8. The apparatus of claim 7, wherein the shield module includes at least one fluid line for supplying a fluid to a space between the edge of the substrate and the shield module when the immersion fluid does not cover the edge of the substrate during processing.

9. The apparatus of claim 7, wherein the substrate table includes at least one fluid line for supplying a fluid to a space between the edge of the substrate and the shield module when the immersion fluid does not cover the edge of the substrate during processing.

10. An immersion lithography method, comprising:

loading and securing a wafer onto a wafer stage disposed beneath an imaging lens;

covering, without contacting the wafer, an edge of the wafer and a portion of a top surface of the wafer that extends from the edge with a shield module, wherein at least a portion of the shield module has a curved shape;

moving the wafer stage so that an area of the top surface of the wafer to be exposed is aligned with the imaging lens;

performing an exposure process to the area of the wafer; and moving the wafer stage to a next location and repeating some of the previous steps until exposure of the wafer is complete.

11. The method of claim 10, wherein the step of loading and securing the wafer onto a wafer stage includes moving at least two separate sections of the shield module radially outward.

12. The method of claim 10, wherein the step of covering the edge of the wafer includes moving at least two separate sections of the shield module radially inward to cover the portion of the top surface of the wafer.

13. The method of claim 10, further comprising the step of adjusting the shield module according to a recipe setting.

14. The method of claim 10, further comprising the step of supplying a fluid to a space between the edge of the wafer and the shield module when the immersion fluid does not cover the edge of the wafer during processing.

15. The method of claim 10, further comprising the steps of:

providing a wafer having a photoresist layer formed thereon;

performing a post-exposure bake on the exposed photoresist layer; and developing the exposed photoresist layer to form a patterned photoresist layer.

16. An immersion lithography system, comprising:

an immersion hood including an imaging lens module and a fluid retaining module, wherein the fluid retaining module provides an immersion fluid, a wafer stage disposed beneath the immersion hood for securing a wafer to be processed;

a drain system for removing the immersion fluid provided to a space between the immersion hood and the wafer on the wafer stage, wherein the drain system includes a plurality of extraction lines located in the immersion hood and wafer stage; and a cover plate for covering an area around an edge of the wafer and a portion of a top surface of the wafer that extends from the edge without contacting the wafer during processing, wherein at least a portion of the cover plate has a curved shape.

17. The system of claim 16, wherein the cover plate includes a plurality of sections, wherein each of the plurality of sections is configured to move radially such that the covered area around the edge of the wafer can be adjusted.

18. The system of claim 16, wherein the cover plate includes at least one fluid line for supplying a fluid to the edge of the wafer.

19. The system of claim 16, wherein the wafer stage includes at least one fluid line for supplying a fluid to the edge of the wafer.

20. The system of claim 16, wherein the immersion hood includes a purge unit for purging a space between the edge of the wafer and the cover plate with a fluid.

* * * * *